United States Patent
Nam et al.

(10) Patent No.: US 10,825,391 B2
(45) Date of Patent: Nov. 3, 2020

(54) PIXEL OF ORGANIC LIGHT EMITTING DISPLAY DEVICE AND ORGANIC LIGHT EMITTING DISPLAY DEVICE HAVING THE SAME

(71) Applicant: Samsung Display Co., Ltd., Yongin-Si, Gyeonggi-Do (KR)

(72) Inventors: Hui Nam, Yongin-si (KR); Myungho Lee, Anyang-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/238,123

(22) Filed: Jan. 2, 2019

(65) Prior Publication Data

US 2019/0206320 A1  Jul. 4, 2019

(30) Foreign Application Priority Data

Jan. 2, 2018 (KR) .......................... 10-2018-0000357

(51) Int. Cl.
*G09G 3/3233* (2016.01)
*G09G 3/3258* (2016.01)
(Continued)

(52) U.S. Cl.
CPC ............. *G09G 3/3233* (2013.01); *G09G 3/20* (2013.01); *G09G 3/3258* (2013.01);
(Continued)

(58) Field of Classification Search
CPC ... G09G 2300/0426; G09G 2300/0439; G09G 2310/08; G09G 3/20; G09G 3/3233;
(Continued)

(56) References Cited

U.S. PATENT DOCUMENTS

| | | | |
|---|---|---|---|
| 2006/0055336 A1* | 3/2006 | Jeong ................... | G09G 3/3233 315/169.3 |
| 2012/0001896 A1* | 1/2012 | Han ..................... | G09G 3/3233 345/214 |

(Continued)

FOREIGN PATENT DOCUMENTS

| | | |
|---|---|---|
| KR | 100673759 B1 | 1/2007 |
| KR | 1020150070718 A | 6/2015 |
| KR | 1020170031321 A | 3/2017 |

*Primary Examiner* — Hong Zhou
(74) *Attorney, Agent, or Firm* — Innovation Counsel LLP (57) ABSTRACT

A pixel of an organic light emitting display device and an organic light emitting display device having the same includes an organic light emitting diode, a first switching transistor configured to transfer a data signal, a storage capacitor configured to store the data signal, a driving transistor configured to generate a driving current of the organic light emitting diode, a first initialization transistor and a second initialization transistor configured to simultaneously provide an initialization signal to the organic light emitting diode and the driving transistor, a second switching transistor configured to be turned on in response to a second scan signal and transfer the data signal or the initialization signal, a first emission control transistor configured to transfer a high power voltage to the driving transistor, and a second emission control transistor configured to transfer the driving current to the organic light emitting diode.

4 Claims, 10 Drawing Sheets

(51) Int. Cl.
*G09G 3/3266* (2016.01)
*G09G 3/3283* (2016.01)
*H01L 27/32* (2006.01)
*G09G 3/20* (2006.01)

(52) U.S. Cl.
CPC ......... *G09G 3/3266* (2013.01); *G09G 3/3283* (2013.01); *G09G 2300/0426* (2013.01); *G09G 2300/0439* (2013.01); *G09G 2310/08* (2013.01); *H01L 27/3276* (2013.01)

(58) Field of Classification Search
CPC .. G09G 3/3258; G09G 3/3266; G09G 3/3283; H01L 27/3276
See application file for complete search history.

(56) References Cited

U.S. PATENT DOCUMENTS

| | | | |
|---|---|---|---|
| 2015/0170576 A1* | 6/2015 | Bae | G09G 3/3225 345/205 |
| 2015/0379930 A1* | 12/2015 | Lee | G09G 3/3233 345/76 |
| 2016/0043159 A1* | 2/2016 | Kim | H01L 27/3265 257/71 |

* cited by examiner

PIXEL OF ORGANIC LIGHT EMITTING DISPLAY DEVICE AND ORGANIC LIGHT EMITTING DISPLAY DEVICE HAVING THE SAME

CROSS-REFERENCE TO RELATED APPLICATION(S)

This application claims priority under 35 USC § 119 to Korean Patent Application No. 10-2018-0000357, filed on Jan. 2, 2018 in the Korean Intellectual Property Office (KIPO), the contents of which are incorporated herein in its entirety by reference.

BACKGROUND

1. Technical Field

Example embodiments relate generally to a pixel of an organic light emitting display device and an organic light emitting display device having the same.

2. Description of the Related Art

Flat panel display (FPD) devices are widely used as a display device of electronic devices because FPD devices are relatively lightweight and thin compared to cathode-ray tube (CRT) display device. Examples of FPD devices are liquid crystal display (LCD) devices, field emission display (FED) devices, plasma display panel (PDP) devices, and organic light emitting display (OLED) devices. The OLED devices have been spotlighted as next-generation display devices because the OLED devices have various advantages such as a wide viewing angle, a rapid response speed, a thin thickness, low power consumption, etc. Recently, a low frequency driving method for decreasing power consumption is studied.

SUMMARY

Some example embodiments provide a pixel of an organic light emitting display device capable of improving display quality.

Some example embodiments provide an organic light emitting device capable of improving display quality.

According to an aspect of example embodiments, a pixel of an organic light emitting display device may include an organic light emitting diode, a first switching transistor configured to be turned on in response to a first scan signal and transfer a data signal, a storage capacitor configured to store the data signal, a driving transistor configured to provide a driving current to the organic light emitting diode based on the data signal, a first initialization transistor and a second initialization transistor configured to be turned on in response to an initialization control signal and simultaneously provide an initialization signal to the organic light emitting diode and the driving transistor, a second switching transistor configured to be turned on in response to a second scan signal and transfer the data signal or the initialization signal, a first emission control transistor configured to be turned on in response to an emission control signal and transfer a high power voltage to the driving transistor, and a second emission control transistor configured to be turned on in response to the emission control signal and transfer the driving current to the organic light emitting diode.

In example embodiments, the first initialization transistor and the second initialization transistor may be coupled in series, and a node at which the first initialization transistor and the second initialization transistor are coupled may be coupled to an anode electrode of the organic light emitting diode.

In example embodiments, the first initialization transistor and the second initialization transistor may be coupled between an initialization signal providing line that provides the initialization signal and the second switching transistor.

In example embodiments, the second switching transistor may be turned on when the first initialization transistor and the second transistor are turned on in response to the initialization control signal, and transfer the initialization signal to the driving transistor.

In example embodiments, the second switching transistor may be turned on when the first switching transistor is turned on in response to the first scan signal, and transfer the data signal to the storage capacitor.

In example embodiments, the first emission control transistor may be coupled between a high power voltage providing line that provides the high power voltage and the driving transistor, and the second emission control transistor may be coupled between the driving transistor and the organic light emitting diode.

In example embodiments, the initialization control signal and the second scan signal may be provided during an initialization period, the first scan signal and the second scan signal may be provided during a data writing period and a threshold voltage compensation period, and the emission control signal may be provided during an emission period.

In example embodiments, the first switching transistor, the driving transistor, the first initialization transistor, the second initialization transistor, the second switching transistor, the first emission control transistor, and the second emission transistor may be implemented as PMOS (P-channel Metal Oxide Semiconductor) transistors.

In example embodiments, the first switching transistor, the driving transistor, the first initialization transistor, the second initialization transistor, the second switching transistor, the first emission control transistor, and the second emission transistor may be implemented as NMOS (N-channel Metal Oxide Semiconductor) transistors.

According to an aspect of example embodiments, an organic light emitting display device may include a display panel including a plurality of pixels, a data driver configured to provide a data signal to the pixel, a scan driver configured to provide a first scan signal and a second scan signal, and a timing controller configured to generate a control signal that controls the data driver and the scan driver. The pixel may include an organic light emitting diode, a first switching transistor configured to be turned on in response to the first scan signal and transfer the data signal, a storage capacitor configured to store the data signal, a driving transistor configured to provide a driving current to the organic light emitting diode based on the data signal, a first initialization transistor and a second initialization transistor configured to be turned on in response to an initialization control signal and simultaneously provide an initialization signal to the organic light emitting diode and the driving transistor, a second switching transistor configured to be turned on in response to the second scan signal and transfer the data signal or the initialization signal, a first emission control transistor configured to be turned on in response to an emission control signal and transfer a high power voltage to the driving transistor, and a second emission control transistor configured to be turned on in response to the emission control signal and transfer the driving current to the organic light emitting diode.

In example embodiments, the first initialization transistor and the second initialization transistor may be coupled in series, and a node at which the first initialization transistor and the second initialization transistor may be coupled is coupled to an anode electrode of the organic light emitting diode.

In example embodiments, the first initialization transistor and the second initialization transistor may be coupled between an initialization signal providing line that provides the initialization signal and the second switching transistor.

In example embodiments, the second switching transistor may be turned on when the first initialization transistor and the second transistor are turned on in response to the initialization control signal, and transfer the initialization signal to the driving transistor.

In example embodiments, the second switching transistor may be turned on when the first switching transistor is turned on in response to the first scan signal, and transfer the data signal to the storage capacitor.

In example embodiments, the first emission control transistor may be coupled between a high power voltage providing line that provides the high power voltage and the driving transistor, and the second emission control transistor may be coupled between the driving transistor and the organic light emitting diode.

In example embodiments, the initialization control signal and the second scan signal may be provided during an initialization period, the first scan signal and the second scan signal may be provided during a data writing period and a threshold voltage compensation period, and the emission control signal may be provided during an emission period.

In example embodiments, the first switching transistor, the driving transistor, the first initialization transistor, the second initialization transistor, the second switching transistor, the first emission control transistor, and the second emission transistor may be implemented as PMOS (P-channel Metal Oxide Semiconductor) transistors.

In example embodiments, the first switching transistor, the driving transistor, the first initialization transistor, the second initialization transistor, the second switching transistor, the first emission control transistor, and the second emission transistor may be implemented as NMOS (N-channel Metal Oxide Semiconductor) transistors.

In example embodiments, the organic light emitting display device further includes an emission controller configured to provide the emission control signal.

Therefore, the pixel of the organic light emitting display device and the organic light emitting display device having the same may improve a leakage current occurred in a gate electrode of the driving transistor by decreasing the number of switching transistors coupled to the gate electrode of the driving transistor when the organic light emitting display device is driven using a low frequency driving method. Further, the pixel of the organic light emitting display device and the organic light emitting display device having the same may simultaneously initialize the organic light emitting diode and the driving transistor by including the first initialization transistor and the second initialization transistor coupled in series.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Hereinafter, the present inventive concept will be explained in detail with reference to the accompanying drawings.

Figure 1:
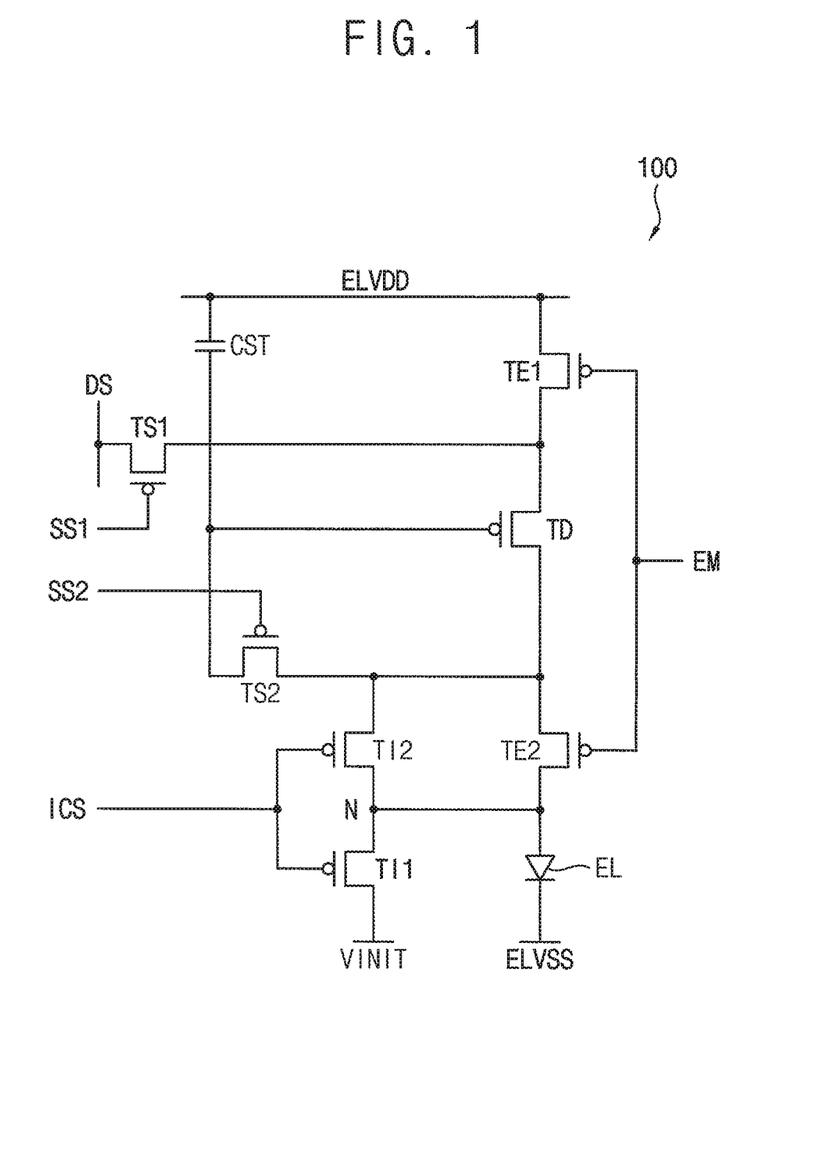
FIG. 1 is a circuit diagram illustrating a pixel of an organic light emitting display device according to example embodiments.
Figure 2A:
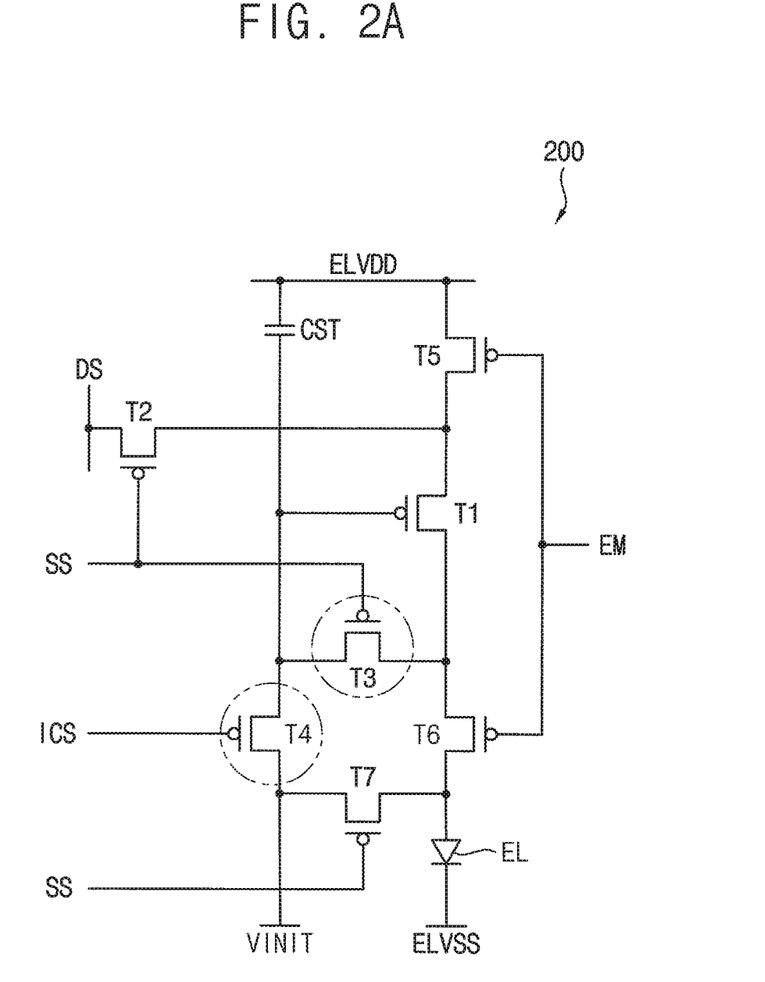
FIGS. 2A, 2B and 2C are diagrams illustrating for describing a related art.
Figure 2B:
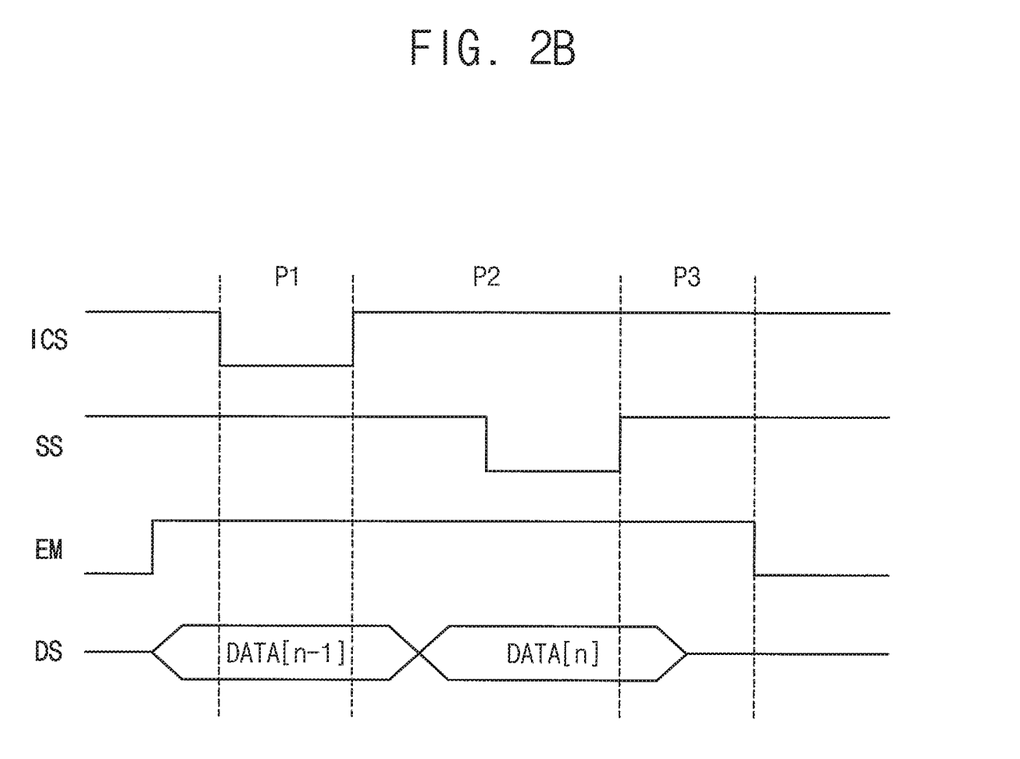
Figure 2C:
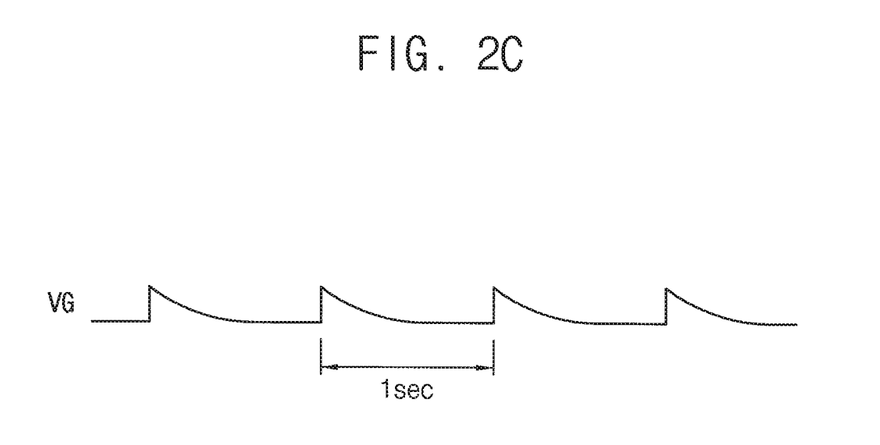

FIG. 1 is a circuit diagram illustrating a pixel of an organic light emitting display device according to example embodiments and FIGS. 2A through 2C are diagrams illustrating for describing a related art.

Referring to FIG. 1, a pixel of an organic light emitting display device may include an organic light emitting diode EL, a first switching transistor TS1, a storage capacitor CST, a driving transistor TD, a first initialization transistor TI1, a second initialization transistor TI2, a second switching transistor TS2, a first emission control transistor TE1, and a second emission control transistor TE2.

Referring to FIG. 2A, a pixel 200 of an organic light emitting display device of a related art may include an organic light emitting diode EL, first through seventh transistors, and a storage capacitor CST. Here, the first transistor T1 may be a driving transistor. The second transistor T2, the third transistor T3, the fourth transistor T4, and the seventh transistor T7 may be switching transistors for transferring a data signal DS and an initialization signal VINIT. The initialization signal VINIT may be a voltage signal having a predetermined voltage level. The fifth transistor T5 and the sixth transistor T6 may be the emission control transistors for controlling a light emission of the organic light emitting diode EL.

Referring to FIG. 2B, the pixel 200 of FIG. 2A may be operated in a first period P1, a second period P2, and a third period P3. The pixel 200 of FIG. 2 may initialize a gate electrode of the first transistor T1 (i.e., the driving transistor) during the first period P1. The fourth transistor T4 may be turned on and the initialization signal VINIT may be provided to the gate electrode of the first transistor T1, when an initialization control signal ICS having a low level is provided during the first period P1. The second transistor T2, the third transistor T3, and the seventh transistor T7 may be turned on when a scan signal SS having a low level is provided during the second period P2. The initialization signal VINIT may be provided to an anode electrode of the organic light emitting diode EL when the seventh transistor T7 is turned on. Further, the second transistor T2 and the third transistor T3 may be turned on and the data signal DS to which a threshold voltage of the first transistor T1 is compensated may be stored in the storage capacitor CST. The fifth transistor T5 and the sixth transistor T6 may be turned on when an emission control signal EM having a low level is provided during the third period P3. A high power voltage ELVDD may be provided to the first transistor T1 when the fifth transistor T5 is turned on. A driving current generated in the first transistor T1 may be provide to the organic light emitting diode EL when the sixth transistor T6 is turned on.

A voltage level VG of the gate electrode of the first transistor T1 (i.e., the driving transistor) should be constantly maintained for a low frequency driving of the organic light emitting display device. However, the third transistor T3 and the fourth transistor T4 coupled to the gate electrode of the first transistor T1 may form a leakage path. That is, leakage current may occur via the third transistor T3 and the fourth transistor T4 and the voltage level VG of the gate electrode of the first transistor T1 may decrease by the leakage current as described in FIG. 2C. Luminance of the organic light emitting diode EL may be changed due to the voltage drop of the gate electrode of the first transistor T1 and defects such as a flicker may occur. To overcome this problem, the pixel 100 of the organic light emitting display device according to example embodiments may decrease the number of the transistors coupled to the gate electrode of the driving transistor TD by connecting initialization transistors that receives the initialization signal VINIT to the driving transistor TD through the second switching transistor TS12. Hereinafter, the pixel 100 of the organic light emitting display device will be described in detail referring to FIG. 1.

Referring to FIG. 1, the first switching transistor TS1 may be turned on in response to a first scan signal SS1 and transfer the data signal DS. The first switching transistor TS may include a first electrode, a gate electrode, and a second electrode. The first electrode of the first switching transistor Ts1 may be coupled to a data line thorough which the data signal DS is provided. The gate electrode of the first switching transistor TS1 may be coupled to a first scan line through which the first scan signal SS1 is provided. The second electrode of the first switching transistor TS1 may be coupled to the driving transistor TD. The first switching transistor TS1 may be turned on when the first scan signal SS1 having a low level is provided to the gate electrode of the first switching transistor TS1. The first switching transistor TS1 may transfer the data signal DS provided through the first electrode when the first switching transistor TS1 is turned on.

The storage capacitor CST may store the data signal DS. The storage capacitor CST may include a first electrode and a second electrode. The first electrode of the storage capacitor CST may be coupled to a high voltage power providing line through which a high power voltage ELVDD is provided. The second electrode of the storage capacitor CST may be coupled to the gate electrode of the driving transistor TD and a first electrode of the second switching transistor TS2. The storage capacitor CST may store the data signal provided through the second switching transistor TS2 coupled to the second electrode.

The driving transistor TD may generate a driving current which is provided to the organic light emitting diode EL based on the data signal DA. The driving transistor TD may include a first electrode, a gate electrode, and a second electrode. The first electrode of the driving transistor TD may be coupled to the first switching transistor TS1 and the first emission control transistor TE1. The gate electrode of the driving transistor TD may be coupled to the storage capacitor CST and the second switching transistor TS2. The second electrode of the driving transistor TD may be coupled to the second emission control transistor TE2. The driving transistor TD may generate the driving current based on the data signal stored in the storage capacitor CST. Further, the gate electrode of the driving transistor TD may be initialized by the initialization signal VINIT transferred through the second switching transistor TS2.

The first initialization transistor TI1 and the second initialization transistor TI2 may be turned on in response to the initialization control signal ICS and simultaneously provide the initialization signal VINIT to the anode electrode of the organic light emitting diode EL and the gate of the driving transistor TD. The first initialization transistor TI1 may include a first electrode, a gate electrode, and a second electrode. The first electrode of the initialization transistor TI1 may be coupled to an initialization signal providing line through which the initialization signal VINIT is provided. The gate electrode of the first initialization transistor TI1 may be coupled to an initialization control signal providing line through which the initialization control signal is provided. The second electrode of the first initialization transistor TI1 may be coupled to the second initialization transistor TI2 and the anode electrode of the organic light emitting diode EL. The second initialization transistor TI2 may include a first electrode, a gate electrode, and a second electrode. The first electrode of the second initialization transistor TI2 may be coupled to the first initialization transistor TI1 and the anode electrode of the organic light emitting diode EL. The gate electrode of the second initialization transistor TI2 may be coupled to the initialization control signal providing line through which the initialization control signal is provided. The second electrode of the second initialization transistor TI2 may be coupled to the second switching transistor TS2.

The first initialization transistor TI1 and the second initialization transistor TI2 may be coupled between the initialization signal providing line that provides the initialization signal VINIT and the second switching transistor TS2. The first initialization transistor TI1 and the second initialization transistor TI2 may be coupled in series. That is, the second electrode of the first initialization transistor TI1 and the first electrode of the second initialization transistor TI2 may be coupled. A node N at which the first initialization transistor TI1 and the second initialization transistor TI2 are coupled may be coupled to the anode electrode of the organic light emitting diode EL. Further, the gate electrode of the first initialization transistor TI1 and the gate electrode of the second initialization transistor TI2 may be coupled. Thus, the first initialization transistor TI1 and the second initialization transistor TI2 may be simultaneously turned on or turned off in response to the initialization control signal ICS. The first initialization transistor TI1 and the second initialization transistor TI2 may be simultaneously turned on when the initialization control signal ICS having the low level is provided. The organic light emitting diode EL and the driving transistor TD may be simultaneously initialized when the first initialization transistor TI1 and the second initialization transistor TI2 are turned on. Specifically, the anode electrode of the organic light emitting diode EL may be initialized by the initialization signal VINIT provided through the first electrode of the first initialization transistor TI1 when the first initialization transistor TI1 is turned on. The initialization signal VINIT provided through the first electrode of the second initialization transistor TI2 may be transferred to the second switching transistor TS2 when the second initialization transistor TI2 is turned on.

The second switching transistor TS2 may be turned on in response to a second scan signal SS2 and transfer the data signal DS or the initialization signal VINIT. The second switching transistor TS2 may include a first electrode, a gate electrode, and a second electrode. The first electrode of the second switching transistor TS2 may be coupled to the gate electrode of the first transistor TD and the storage capacitor CST. The gate electrode of the second switching transistor TS2 may be coupled to a second scan line through which s second scan signal SS2 is provided. The second electrode of the second switching transistor TS2 may be coupled to the gate electrode of the driving transistor TD and the second initialization transistor TI2. The second switching transistor TS2 may be turned on when the second scan signal SS2 having the low level is provided. The second switching transistor TS2 may transfer the data signal DS or the initialization signal VINIT when the first switching transistor TS1 or the second switching transistor TS2 is turned on. The second switching transistor TS2 may transfer the data signal DS provided through the first switching transistor TS1 to the storage capacitor CST when the first scan signal SS1 having the low level and the second scan signal SS2 having the low level are provided. Further, the second switching transistor TS2 may transfer the initialization signal VINIT provided through the first initialization transistor TI1 and the second initialization transistor TI2 to the driving transistor TD.

The first emission control transistor TE1 and the second emission control transistor TE2 may be turned on in response to the emission control signal EM, transfer the high power voltage ELVDD to the driving transistor, and transfer the driving current to the organic light emitting diode EL which is connected between the high power voltage ELVDD and a low power voltage ELVSS. The first emission control transistor TE1 may include a first electrode, a gate electrode, and a second electrode. The first electrode of the first emission control transistor TE1 may be coupled to the high power voltage providing line. The gate electrode of the first emission control transistor TE1 may be coupled to an emission control line through which the emission control signal EM is provided. The second electrode of the first emission control transistor TE1 may be coupled to the driving transistor TD. The second emission control transistor TE2 may include a first electrode, a gate electrode, and a second electrode. The first electrode of the second emission control transistor TE2 may be coupled to the driving transistor TD. The gate electrode of the second emission control transistor TE2 may be coupled to the emission control line through which the emission control signal EM is provided. The second electrode of the second emission control transistor TE2 may be coupled to the anode electrode of the organic light emitting diode EL.

The first emission control transistor TE1 may be coupled between the high power voltage providing line and the driving transistor TD. The first emission control transistor TE1 may be turned on and the high power voltage ELVDD may be provided to the driving transistor TD when the emission control signal EM having the low level is provided. The second emission control transistor TE2 may be coupled between the driving transistor TD and the anode electrode of the organic light emitting diode EL. The second emission control transistor TE2 may be turned on and the driving current generated in the driving transistor TD may be provided to the organic light emitting diode EL when the emission control signal EM having the low level is provided.

Here, the first emission control transistor TE1 and the second emission control transistor TE2 may be simultaneously turned on because the gate electrode of the first emission control transistor TE1 and the gate electrode of the second emission control transistor TE2 are coupled to the same emission control line. The first emission control transistor TE1 may be turned on and the high power voltage providing line and the driving transistor TD may be coupled in series when the emission control signal EM having the low level is provided. The second emission control transistor TE2 may be turned on and the driving transistor TD and the organic light emitting diode EL may be coupled in series when the emission control signal EM having the low level is provided.

The pixel 100 of FIG. 1 may be operated in an initialization period, a data writing period and a threshold voltage compensation period, and an emission period. The initialization control signal ICS and the second scan signal SS2 having the low level may be provided during the initialization period P1. The first initialization transistor TI1, the second initialization transistor TI2, and the second switching transistor TS2 may be turned on and the anode electrode of the organic light emitting diode EL and the gate electrode of the driving transistor TD may be initialized during the initialization period P1. The first scan signal SS1 and the second scan signal SS2 having the low level may be provided during the data writing period and the threshold voltage compensation period P2. The first switching transistor TS1 and the second switching transistor TS2 may be turned on and the data signal of which the threshold of the first driving transistor TD is compensated may be stored in the storage capacitor during the data writing period and the threshold voltage compensation period P2. The emission control signal EM having the low level may be provided during the emission period P3. The first emission control transistor TE1 and the second emission control transistor TE2 may be turned on, the driving current may be provided to the organic light emitting diode EL, and the organic light emitting diode EL may emit light during the emission period. Hereinafter, a driving method of the pixel 100 of FIG. 1 will be described in detail referring to FIGS. 3, 4A, 4B, and 4C.

Although the first switching transistor TS1, the driving transistor TD, the first initialization transistor TI1, the second initialization transistor TI2, the second switching transistor TS2, the first emission control transistor TE1, and the second emission control transistor TE2 implemented as PMOS (P-channel Metal Oxide Semiconductor) transistors are described in FIG. 1, the first switching transistor TS1, the driving transistor TD, the first initialization transistor TI1, the second initialization transistor TI2, the second switching transistor TS2, the first emission control transistor TE1, and the second emission control transistor TE2 may not be limited thereto. For example, the first switching transistor TS1, the driving transistor TD, the first initialization transistor TI1, the second initialization transistor TI2, the second switching transistor TS2, the first emission control transistor TE1, and the second emission control transistor TE2 may be implemented as NMOS (N-channel Metal Oxide Semiconductor) transistors.

As described above, the pixel 100 of FIG. 1 may include the first initialization transistor TI1 and the second initialization transistor TI2 coupled to the initialization signal providing line through which the initialization signal VINIT is provided. Here, the first initialization transistor TI1 and the second initialization transistor TI2 may be coupled in series. The node at which the first initialization transistor TI1 and the second initialization transistor TI2 are coupled may be coupled to the anode electrode of the organic light emitting diode EL. Further, the first initialization transistor TI1 and the second initialization transistor TI2 may be coupled to the second switching transistor TS2 which is coupled to the storage capacitor CST and the driving transistor TD. The organic light emitting diode EL and the driving transistor TD may be simultaneously initialized when the first initialization transistor TI1, the second initialization transistor TI2 and the second switching transistor TS2 is turned on. Here, the leakage current occurred in the gate electrode of the driving transistor TD when the organic light display device is driven using the low frequency driving method may decrease because the number of the switching transistor coupled to the gate electrode of the driving transistor TD decreases.

Figure 3:
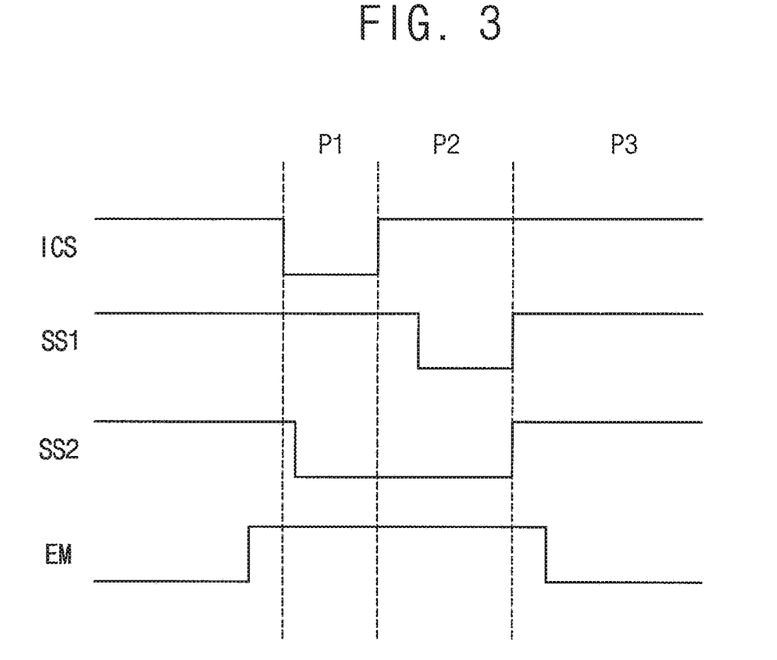
FIG. 3 is a timing chart illustrating for describing an operation of the pixel of the organic light emitting display device of FIG. 1.
Figure 4A:
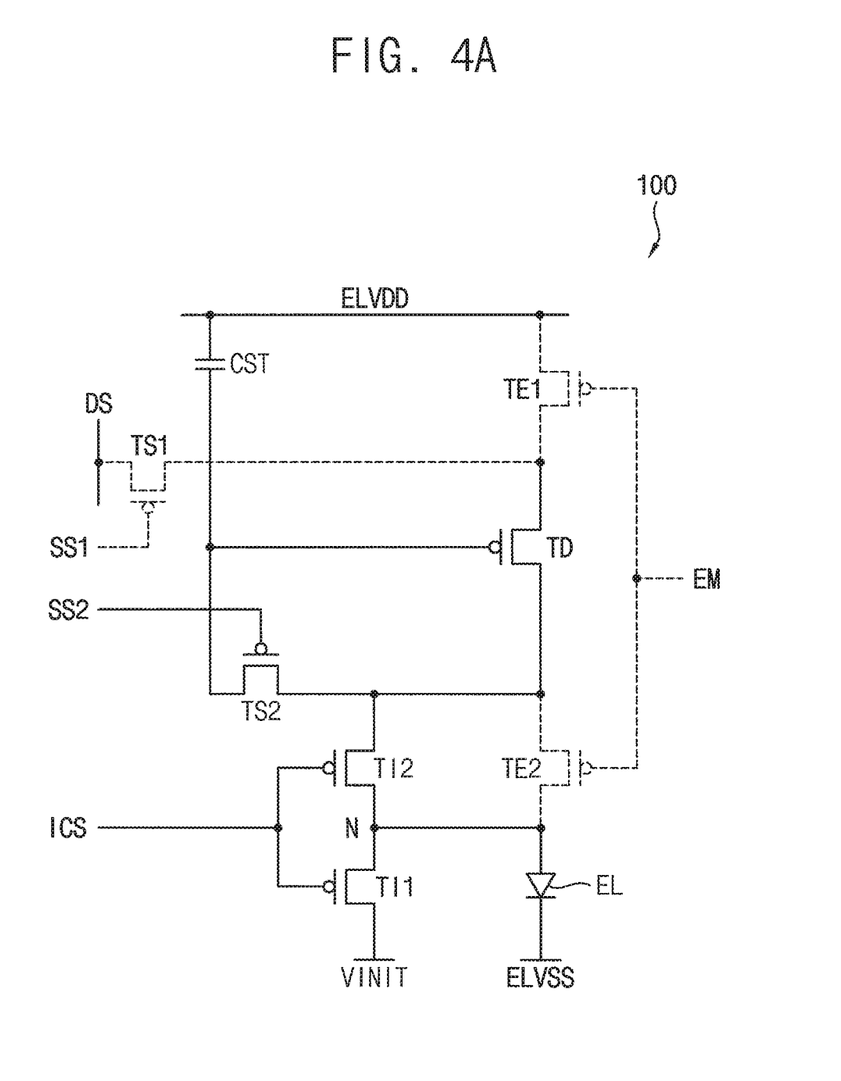
FIGS. 4A, 4B and 4C are circuit diagrams illustrating for describing an operation of the pixel of the organic light emitting display device of FIG. 1.
Figure 4B:
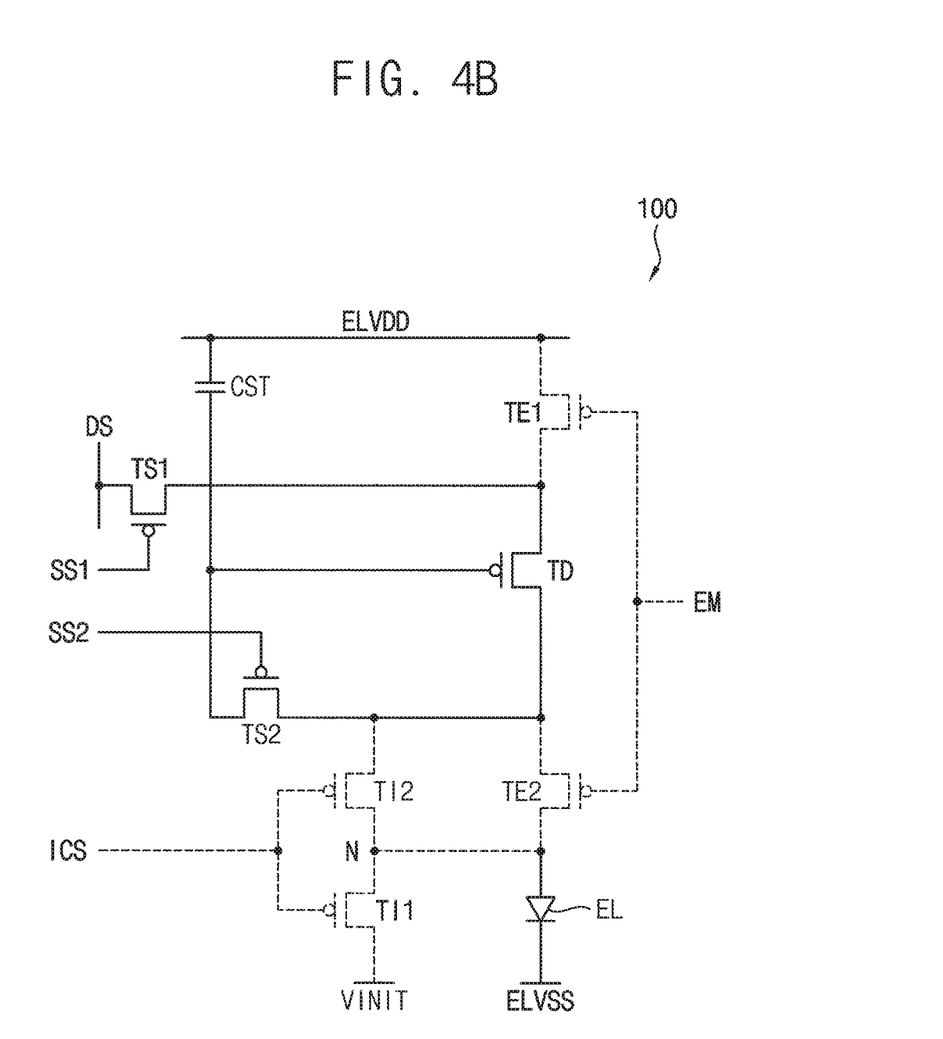
Figure 4C:
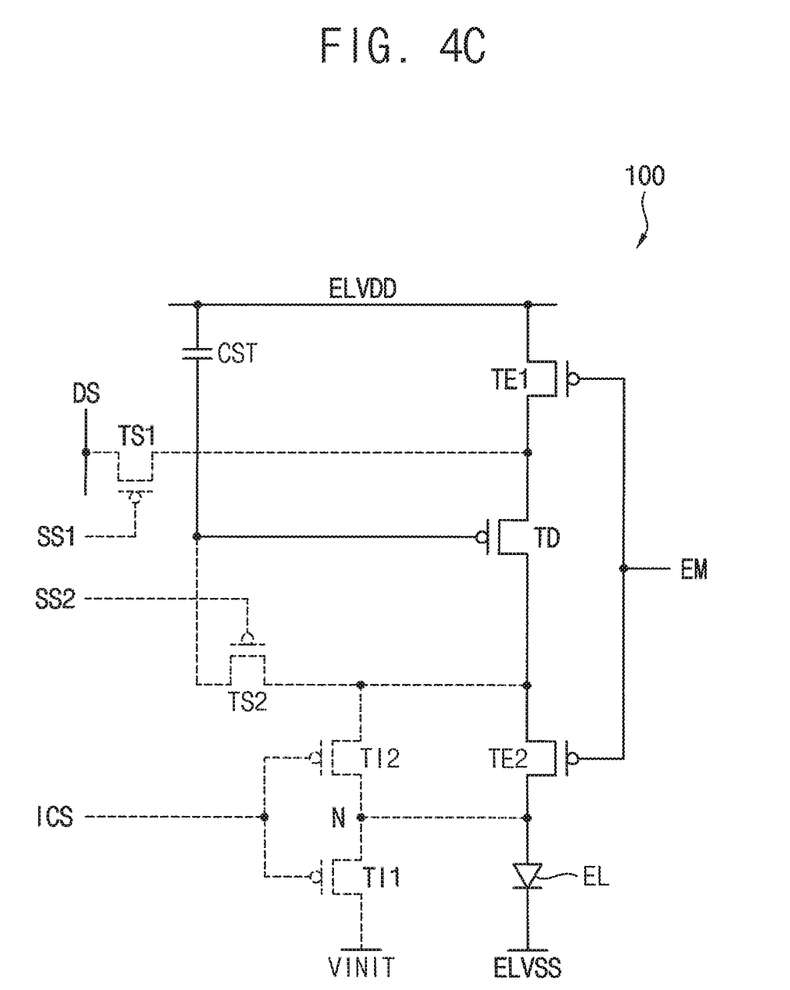

FIG. 3 is a timing chart illustrating for describing an operation of the pixel of the organic light emitting display device of FIG. 1. FIGS. 4A through 4C are circuit diagrams illustrating for describing an operation of the pixel of the organic light emitting display device of FIG. 1.

Referring to FIG. 3, an operation of the pixel 100 of the organic light emitting display device may include a first period P1, a second period P2, and a third period P3.

Referring to FIGS. 3 and 4A, the pixel 100 of the organic light emitting display device may initialize the organic light emitting diode EL and the gate electrode of the driving transistor TD during the first period P1. Here, the first period P1 may be an initialization period. The initialization control signal ICS having a low level, the first scan signal SS1 having a high level, a second scan signal SS2 having the low level, and the emission control signal EM having the high level may be provided to the pixel during the first period P1. The first initialization transistor TI1 and the second initialization transistor TI2 may be turned on in response to the initialization control signal ICS having the low level, and the second switching transistor TS2 may be turned on in response to the second scan signal SS2 having the low level. Further, the first switching transistor TS1 may be turned off in response to the first scan signal SS1 having the high level and the first emission control transistor TE1 and the second emission control transistor TE2 may be turned off in response to the emission control signal EM having the high level.

When the first initialization transistor TI1 is turned on, the initialization signal VINIT provided through the initialization signal providing line may be provide to the node N at which the first initialization transistor TI1 and the second initialization transistor TI2 are coupled and the initialization signal VINIT of the node N may be provided to the anode electrode of the organic light emitting diode EL. Thus, the anode electrode of the organic light emitting diode EL may be initialized. Further, when the second initialization transistor TI2 and the second switching transistor TS2 are turned on, the initialization signal VINIT of the node N may be provided to the gate electrode of the driving transistor TD through the second initialization transistor TI2 and the second switching transistor TS2. Thus, the gate electrode of the driving transistor may be initialized. Here, a voltage of the gate electrode of the driving transistor may be stored in the storage capacitor CST. As described above, the first initialization transistor TI1, the second initialization transistor TI2 and the second switching transistor TS2 are turned on and the anode electrode of the organic light emitting diode EL and the gate electrode of the driving transistor TD may be initialized during the first period P1.

Referring to FIGS. 3 and 4B, the pixel 100 of the organic light emitting display device may store the data signal to which the threshold voltage of the driving transistor TD is compensated in the storage capacitor CST during the second period P2. Here, the second period P2 may be the data writing period and the threshold voltage compensation period. The initialization control signal ICS having the high level, the first scan signal SS1 having the low level, the second scan signal SS2 having the low level, and the emission control signal EM having the high level is provided to the pixel 100 during the second period P2. The first switching transistor TS1 may be turned on in response to the first scan signal SS1 having the low level, and the second switching transistor TS2 may be turned on in response to the second scan signal SS2 having the low level. Further, the first initialization transistor TI1 and the second initialization transistor TI may be turned off in response to the initialization control signal ICS having the high level, and the first emission control transistor TE1 and the second emission control transistor TE2 may be turned off in response to the emission control signal EM having the high level.

The data signal DS provided through the data line may be transferred to the first electrode of the driving transistor TD through the first switching transistor TS1 when the first switching transistor TS1 is turned on. Further, a voltage level of the second electrode of the driving transistor TD and a voltage level of the gate electrode of the driving transistor TD may be the same by the second switching transistor TS2 when the second switching transistor TS2 is turned on. The data signal DS to which the threshold voltage of the driving transistor TD is compensated may be charged to the storage capacitor by a diode connection of the driving transistor TD.

Referring to FIGS. 3 and 4C, the pixel 100 of the organic light emitting display device may emit light during the third period P3. Here, the third period P3 may be the emission period. The initialization control signal ICS having the high level, the first scan signal SS1 having the high level, the second scan signal SS2 having the high level, and the emission control signal EM having the low level may be provided to the pixel 100 during the third period P3. The first emission control transistor TE1 and the second emission control transistor TE2 may be turned on in response to the emission control signal EM having the low level. Further, the first initialization transistor TI1 and the second initialization transistor TI2 may be turned off in response to the initialization control signal ICS having the high level, the first switching transistor TS1 may be turned off in response to the first scan signal SS1 having the high level, and the second switching transistor TS2 may be turned off in response to the second scan signal SS2.

The high power voltage providing line may be coupled to the first electrode of the driving transistor TD and the high power voltage ELVDD may be provided to the first electrode of the driving transistor TD when the first emission control transistor TE1 is turned on. Here, the driving transistor TD may generate the driving current based on a voltage provided from the storage capacitor CST. The second electrode of the driving transistor TD may be coupled to the anode electrode of the organic light emitting diode EL when the second emission control transistor TE2 is turned on. The driving current generated from the driving transistor TD may flow from the anode electrode of the organic light emitting diode EL to a cathode electrode of the organic light emitting diode EL. Thus, the organic light emitting diode EL may emit light corresponding to the data signal DS during the third period P3.

Figure 5:
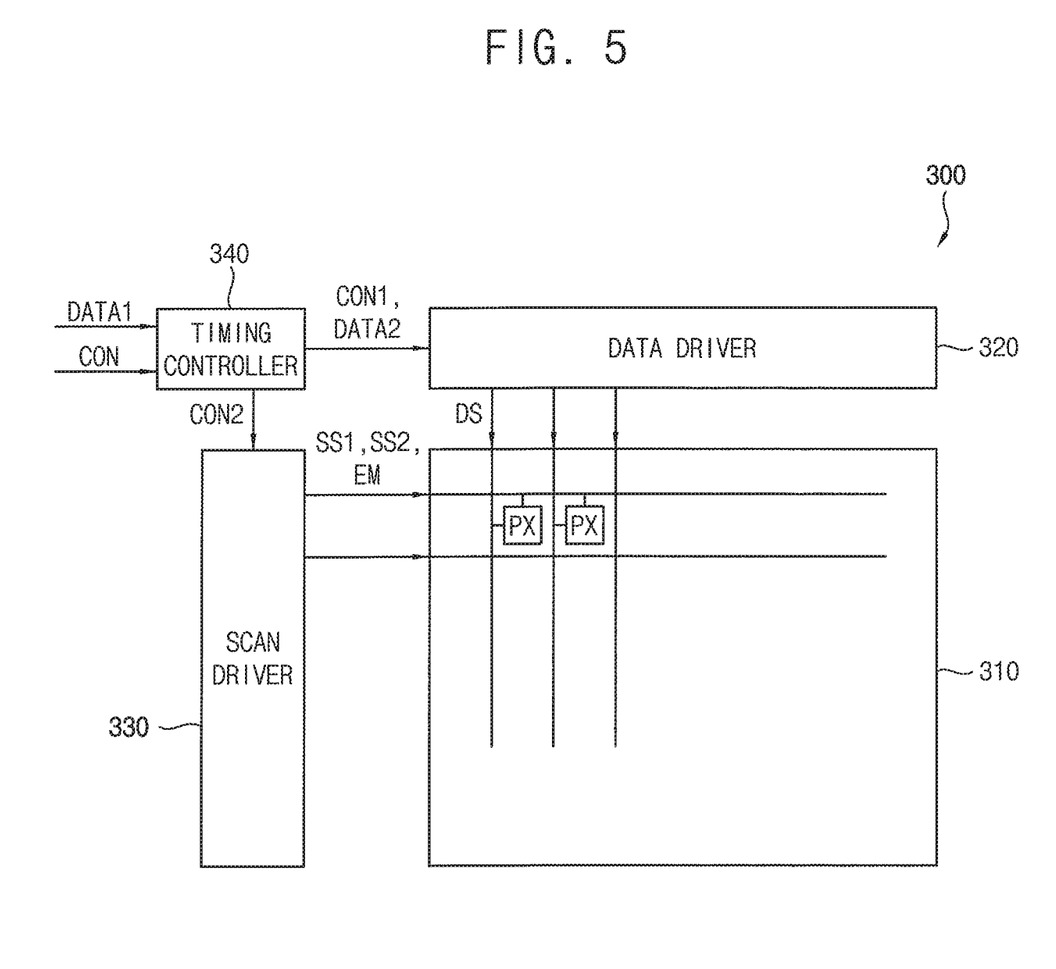
FIG. 5 is a block diagram illustrating an organic light emitting display device according to example embodiments.

FIG. 5 is a block diagram illustrating an organic light emitting display device according to example embodiments.

Referring to FIG. 5, an organic light emitting display device 300 may include a display panel 310, a data driver 320, a scan driver 330, and a timing controller 340.

The display panel 310 may include a plurality of pixels PX. A plurality of data lines, a plurality of scan lines, and a plurality of emission control lines may be formed in the display panel 310. The pixels may be formed in intersection regions of the data lines and the scan lines.

Each of the pixel PX may include an organic light emitting diode, a first switching transistor, a storage capacitor, a driving transistor, a first initialization transistor, a second initialization transistor, a second switching transistor, a first emission control transistor, and a second emission control transistor. The first switching transistor may be turned on in response to a first scan signal SS1 and transfer a data signal DS. The firsts switching transistor may be turned on when the first scan signal SS1 having a low level is provided to a gate electrode of the first switching transistor. The data signal DS provided through a first electrode of the first switching transistor may be transferred to the driving transistor when the first switching transistor is turned on. The storage capacitor may store the data signal DS. The driving transistor may generate a driving current to be provided to the organic light emitting diode based on the data signal DS stored in the storage capacitor. Further, a gate electrode of the driving transistor may be initialized by an initialization signal provided through the second switching transistor. The first initialization transistor and the second initialization transistor may simultaneously provide the initialization signal to the organic light emitting diode and the driving transistor by turning on in response to the initialization control signal. The first initialization transistor and the second initialization transistor may be coupled between an initialization signal providing line through which the initialization signal is provided and the second switching transistor. The first initialization transistor and the second initialization transistor may be coupled in series. A node at which the first initialization transistor and the second initialization transistor are coupled may be coupled to an anode electrode of the organic light emitting diode. The first initialization transistor and the second initialization transistor may simultaneously be turned on or turned off in response to the initialization control signal. The first initialization transistor and the second initialization transistor may simultaneously be turned on when the initialization control signal having the low level is provided. The organic light emitting diode and the driving transistor may be simultaneously initialized when the first initialization transistor and the second initialization transistor are turned on. Specifically, the initialization signal provided through the first electrode of the first initialization transistor may initialize the anode electrode of the organic light emitting diode when the first initialization transistor is turned on. The initialization signal provided through the first electrode of the second initialization transistor may be transferred to the second switching transistor when the second initialization transistor is turned on. The second switching transistor may be turned on in response to the second scan signal to transfer the data signal DS or the initialization signal. The second switching transistor may be turned on when the second scan signal SS2 having the low level is provided. The second switching transistor may transfer the data signal DS or the initialization signal in accordance with the turning on or turning off of the first switching transistor and the second initialization transistor. The first emission control transistor and the second emission control transistor may be turned on in response to the emission control signal EM, transfer the high power voltage to the driving transistor, and transfer the driving current to the organic light emitting diode. The first emission control transistor may be coupled between the high power voltage providing line and the driving transistor. The first emission control transistor may be turned on and the high power voltage may be provided to the driving transistor when the emission control signal EM having the low level is provided to the first emission control transistor. The second emission control transistor may be coupled between the driving transistor and the organic light emitting diode. The second emission control transistor may be turned on and the driving current generated in the driving transistor may be provided to the organic light emitting diode when the emission control signal EM having the low level is provide to the second emission control transistor.

Each of the pixels PX may be operated in an initialization period, a data writing period and a threshold voltage compensation period, and an emission period. The initialization control signal and the second scan signal SS2 may be provided to the pixel PX during the initialization period. The first initialization transistor, the second initialization transistor, and the second switching transistor may be turned on and the anode electrode of the organic light emitting diode and the gate electrode of the driving transistor may be initialized in the initialization period. The first scan signal SS1 and the second scan signal SS2 may be provided to the pixel PX during the data writing period and the threshold voltage compensation period. The first switching transistor and the second switching transistor may be turned on and the data signal DS and the threshold voltage of the driving transistor may be stored in the storage capacitor during the data writing period and the threshold voltage compensation period. The emission control signal EM may be provided to the pixel PX during the emission period. The first emission control transistor and the second emission control transistor may be turned on, the driving current may be provided to the organic light emitting diode, and the organic light emitting diode may emit light based on the driving current during the emission period.

The scan driver 330 may provide the first scan signal SS1 and the second scan signal SS2 to the pixels PX through the scan lines. Further, the scan driver 330 may provide the emission control signal EM to the pixels PX through the emission control lines. The data driver 320 may provide the data signal DS to the pixels PX through the data lines in response to the first scan signal SS1 and the second scan signal SS2. The timing controller 340 may receive a control signal CON from en external device and generate control signals CON1, CON2 that control the data driver 320 and the scan driver 330, respectively. Further, the timing controller 350 may receive a first image data DATA1 from the external device and provide the second image data DATA2 to the data driver 320. The timing controller 340 may provide the first image data DATA1 as it is to the data driver 320 as the second image data DATA2. Alternatively, the timing controller 340 may provide the second image data DATA2, which is a compensated first image data DATA1, to the data driver 320.

As described above, the organic light emitting display device 300 of FIG. 5 may include the pixels PX that include the first initialization transistor and the second initialization transistor coupled to the initialization signal providing line that provides the initialization signal. Here, the first initialization transistor and the second initialization transistor may be coupled in series and the node to which the first initialization transistor and the second initialization transistor are coupled may be coupled to the organic light emitting diode. Further, the first initialization transistor and the second initialization transistor may be coupled to the second switching transistor coupled to the storage capacitor and the driving transistor. The organic light emitting diode and the driving transistor may be simultaneously initialized when the first initialization transistor and the second initialization transistor are turned on. Here, the leakage current of the gate electrode of the driving transistor may decrease when the organic light emitting display device 300 is driven in the low frequency driving method as the number of the switching transistors coupled to the gate electrode of the driving transistor decreases as compared to the related art.

Figure 6:
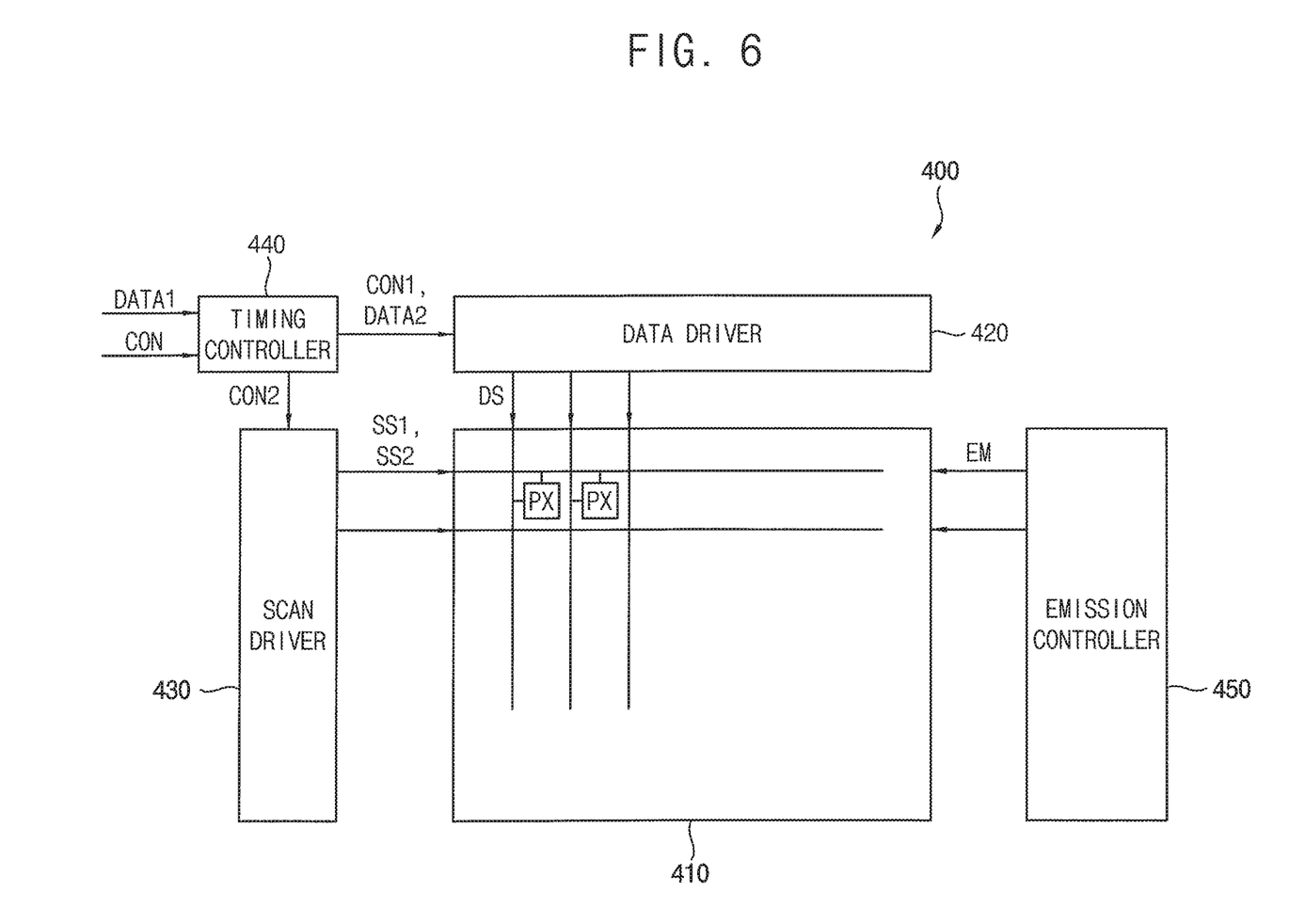
FIG. 6 is a block diagram illustrating other example embodiment of the organic light emitting display device of FIG. 5

FIG. 6 is a block diagram illustrating other example embodiment of the organic light emitting display device of FIG. 5

An organic light emitting display device 400 of FIG. 6 is substantially similar to or the same as the organic light emitting display device 300 of FIG. 5 except for an emission controller 450.

Referring to FIG. 6, the organic light emitting display device 400 may include the emission controller 450. The organic light emitting display device 400 of FIG. 6 may further include the emission controller 450 that provides the emission control signal EM. The emission controller 450 may provide the emission control signal EM through the emission control signal line to the pixels. The emission control signal EM may control a light emission timing of the organic light emitting diode in the pixel.

Figure 7:
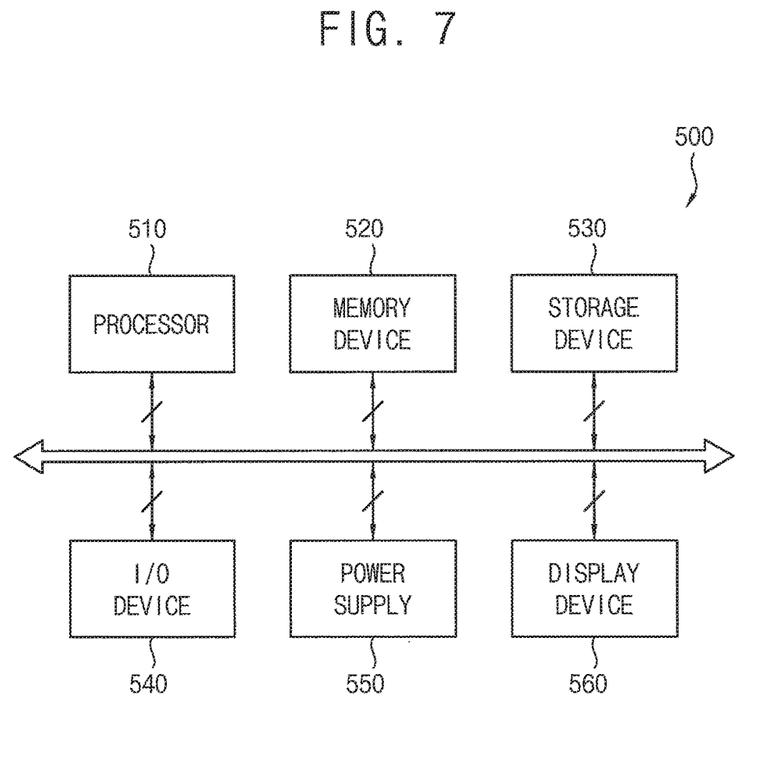
FIG. 7 is a block diagram illustrating an electronic device that includes the organic light emitting display device of FIG. 5.
Figure 8:
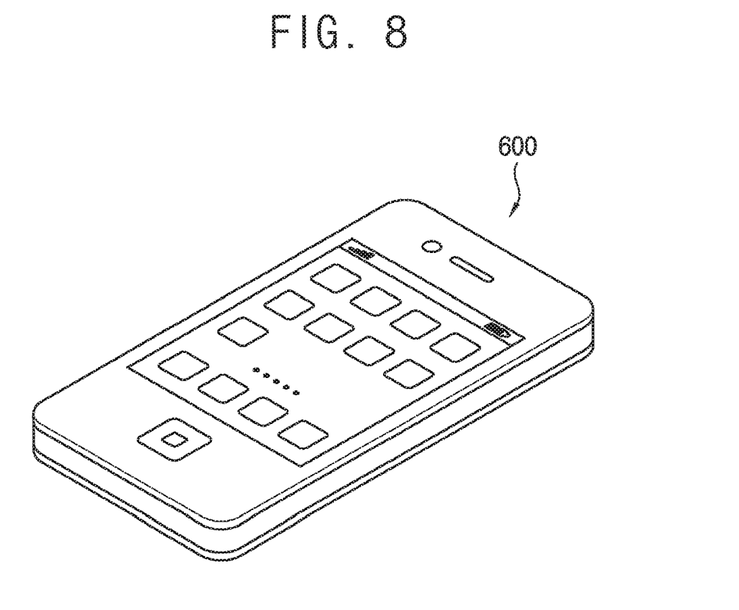
FIG. 8 is a diagram illustrating an example embodiment in which the electronic device of FIG. 7 is implemented as a smart phone.

FIG. 7 is a block diagram illustrating an electronic device that includes the organic light emitting display device of FIG. 5 and FIG. 8 is a diagram illustrating an example embodiment in which the electronic device of FIG. 7 is implemented as a smart phone.

Referring to FIGS. 7 and 8, an electronic device 500 may include a processor 510, a memory device 520, a storage device 530, an input/output (I/O) device 540, a power supply 550, and a display device 560. Here, the display device 560 may correspond to the display device 300, 400 of FIGS. 5 and 6. In addition, the electronic device 500 may further include a plurality of ports for communicating a video card, a sound card, a memory card, a universal serial bus (USB) device, other electronic device, etc. Although it is illustrated in FIG. 8 that the electronic device 500 is implemented as a smart phone 600, a kind of the electronic device 500 is not limited thereto.

The processor 510 may perform various computing functions. The processor 510 may be a micro processor, a central processing unit (CPU), etc. The processor 510 may be coupled to other components via an address bus, a control bus, a data bus, etc. Further, the processor 510 may be coupled to an extended bus such as surrounded component interconnect (PCI) bus. The memory device 520 may store data for operations of the electronic device 500. For example, the memory device 520 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile DRAM device, etc. The storage device 530 may be a solid stage drive (SSD) device, a hard disk drive (HDD) device, a CD-ROM device, etc.

The I/O device 540 may be an input device such as a keyboard, a keypad, a touchpad, a touch-screen, a mouse, etc, and an output device such as a printer, a speaker, etc. In some example embodiments, the display device 560 may be included in the I/O device 540. The power supply 550 may provide a power for operations of the electronic device 500. The display device 560 may communicate with other components via the buses or other communication links. As described above, the display device 560 may include a display panel, a data driver, a scan driver, and a timing controller. The display panel may include a plurality of pixels. Each of the pixel may include an organic light emitting diode, a first switching transistor, a storage capacitor, a driving transistor, a first initialization transistor, a second initialization transistor, a second switching transistor, a first emission control transistor, and a second emission control transistor. The second switching transistor, the first initialization transistor, and the second initialization transistor may be turned on and an anode electrode of the organic light emitting diode and a gate electrode of the driving transistor may be initialized during a first period. The first switching transistor and the second switching transistor may be turned on and the data signal, that is compensated a threshold voltage of the driving transistor, may be stored in the storage capacitor during a second period. The first emission control transistor and the second emission control transistor may be turned on and the organic light emitting diode may emit light based on a driving current provided from the driving transistor during a third period. Here, the leakage current occurred in the gate electrode of the driving transistor may decrease as the number of the switching transistors coupled to the gate electrode of the driving transistor decreases. Further, the organic light emitting diode and the driving transistor may be simultaneously initialized by including the first initialization transistor and the second initialization transistor.

The present inventive concept may be applied to a display device and an electronic device having the display device. For example, the present inventive concept may be applied to a computer monitor, a laptop, a digital camera, a cellular phone, a smart phone, a smart pad, a television, a personal digital assistant (PDA), a portable multimedia player (PMP), a MP3 player, a navigation system, a game console, a video phone, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A pixel of an organic light emitting display device comprising:

an organic light emitting diode and a driving transistor serially connected between a high power voltage and a low power voltage;
a first switching transistor connected between a data signal line and a source electrode of the driving transistor;
a storage capacitor connected between the high power voltage and a gate electrode of the driving transistor;
a second switching transistor connected between the gate electrode of the driving transistor and a drain electrode of the driving transistor;
a first initialization transistor and a second initialization transistor serially connected between a drain electrode of the driving transistor and an initialization line; and
a first emission control transistor connected between the drain electrode of the driving transistor and an anode of the organic light emitting diode,
wherein a node disposed between the first initialization transistor and the second initialization transistor is connected to the anode of the organic light emitting diode, a first electrode of the first initialization transistor is connected to the initialization line, a second electrode of the first initialization transistor is connected to a first electrode of the second initialization transistor at the node, and a second electrode of the second initialization transistor is directly connected to the drain electrode of the driving transistor,
wherein a gate electrode of the first switching transistor is connected to a first scan signal line which provides a first scan signal and a gate electrode of the second switching transistor is connected to a second scan signal line which provides a second scan signal different from the first scan signal,
wherein the second switching transistor is turned on in response to the second scan signal before the first switching transistor is turned on in response to the first scan signal,
wherein the first initialization transistor and the second initialization transistor are turned on in response to an initialization control signal before the second switching transistor is turned on in response to the second scan signal, and
wherein a turn-on state of the first initialization transistor and the second initialization transistor does not overlap a turn-on state of the first switching transistor, the turn-on state of the first initialization transistor and the second initialization transistor partially overlaps a turn-on state of the second switching transistor, and the turn-on state of the second switching transistor partially overlaps the turn-on state of the first switching transistor.

2. The pixel of the organic light emitting display device of claim 1, further comprising a second emission control transistor connected between the high power voltage and the source electrode of the driving transistor.

3. An organic light emitting display device comprising:
a display panel including a plurality of pixels;
a data driver configured to provide a data signal to the pixel;
a scan driver configured to provide a first scan signal and a second scan signal; and
a timing controller configured to generate a control signal that controls the data driver and the scan driver,
wherein the pixel includes:
an organic light emitting diode and a driving transistor serially connected between a high power voltage and a low power voltage;
a first switching transistor connected between a data signal line and a source electrode of the driving transistor;
a storage capacitor connected between the high power voltage and a gate electrode of the driving transistor;
a second switching transistor connected between the gate electrode of the driving transistor and a drain electrode of the driving transistor;
a first initialization transistor and a second initialization transistor serially connected between a drain electrode of the driving transistor and an initialization line; and
a first emission control transistor connected between the drain electrode of the driving transistor and an anode of the organic light emitting diode,
wherein a node disposed between the first initialization transistor and the second initialization transistor is connected to the anode of the organic light emitting diode, a first electrode of the first initialization transistor is connected to the initialization line, a second electrode of the first initialization transistor is connected to a first electrode of the second initialization transistor at the node, and a second electrode of the second initialization transistor is directly connected to the drain electrode of the driving transistor,
wherein a gate electrode of the first switching transistor is connected to a first scan signal line which provides a first scan signal and a gate electrode of the second switching transistor is connected to a second scan signal line which provides a second scan signal different from the first scan signal,
wherein the second switching transistor is turned on in response to the second scan signal before the first switching transistor is turned on in response to the first scan signal,
wherein the first initialization transistor and the second initialization transistor are turned on in response to an initialization control signal before the second switching transistor is turned on in response to the second scan signal, and
wherein a turn-on state of the first initialization transistor and the second initialization transistor does not overlap a turn-on state of the first switching transistor, the turn-on state of the first initialization transistor and the second initialization transistor partially overlaps a turn-on state of the second switching transistor, and the turn-on state of the second switching transistor partially overlaps the turn-on state of the first switching transistor.

4. The pixel of the organic light emitting display device of claim 3, further comprising a second emission control transistor connected between the high power voltage and the source electrode of the driving transistor.

* * * * *